United States Patent [19]

Feygenson et al.

[11] Patent Number: 4,981,811
[45] Date of Patent: Jan. 1, 1991

[54] PROCESS FOR FABRICATING LOW DEFECT POLYSILICON

[75] Inventors: Anatoly Feygenson, Exeter Township, Berks County; Chang-Kuei Huang, Wyomissing Hill Borough, both of Pa.

[73] Assignee: AT&T Bell Laboratories, Murray Hill, N.J.

[21] Appl. No.: 508,210

[22] Filed: Apr. 12, 1990

[51] Int. Cl.$^5$ ........................................... H01L 21/465
[52] U.S. Cl. ...................................... 437/46; 437/233; 437/967; 437/228; 156/653
[58] Field of Search ................ 437/228, 967, 233, 46; 148/DIG. 122; 156/646, 653

[56] References Cited

U.S. PATENT DOCUMENTS

| | | | |
|---|---|---|---|
| 4,056,642 | 11/1977 | Saxena | 437/178 |
| 4,243,865 | 2/1981 | Saxena | 156/646 |
| 4,361,461 | 11/1982 | Chang | |
| 4,497,683 | 2/1985 | Celler et al. | 437/89 |
| 4,546,535 | 10/1985 | Shepard | 437/228 |
| 4,549,926 | 10/1985 | Corboy et al. | 437/89 |
| 4,578,142 | 3/1986 | Corboy et al. | 148/DIG. 25 |
| 4,579,609 | 4/1986 | Reif et al. | 437/946 |
| 4,749,440 | 6/1988 | Blackwood et al. | |
| 4,778,776 | 10/1988 | Tong et al. | 437/228 |

OTHER PUBLICATIONS

"Interation of a Silicon Surface with Fluorine and Hydrogen Fluoride," *Russian Journal of Physical Chemistry*, vol. 40, No. 5, May 1966; V. V. Tyapkina and N. S. Guseva, pp. 573 through 576.

"Dielectric and Polysilicon Film Deposition," VLSI Technology, 1983, McGraw-Hill Book Company, pp. 93 through 105.

*Primary Examiner*—Olik Chaudhuri
*Assistant Examiner*—Chandra Chaudhari
*Attorney, Agent, or Firm*—Scott W. McLellan

[57] ABSTRACT

A method of removing natural oxides and other contaminants on silicon or polysilicon and then depositing polysilicon thereon. The natural oxide is substantially removed from the exposed silicon with an anhydrous etchant and then the polysilicon is deposited on the exposed silicon. The etching and depositing steps occur in the same reactor chamber (in-situ). A portion of the end of the selective etching step overlaps with a portion of the beginning of the polysilicon deposition step to achieve an interface between the underlying silicon and the deposited polysilicon that is substantially free of native oxides and other contaminants.

10 Claims, 2 Drawing Sheets

PROCESS FOR FABRICATING LOW DEFECT POLYSILICON

BACKGROUND OF THE INVENTION

1. Field of the Invention

This invention relates to the fabrication of integrated circuits in general and, more particularly, to the fabrication of polysilicon on silicon integrated circuits.

2. Description of the Prior Art

Polycrystalline silicon, commonly known as polysilicon, is widely used in integrated circuit manufacturing. Polysilicon may be used as conductors and as contacts to the integrated circuit's silicon substrate as well as emitters in high performance bipolar integrated circuits. For example, in MOS integrated circuit technologies, the polysilicon may be used as contacts to source and drain diffusions in the silicon substrate of MOS transistors. In bipolar integrated circuit technology, using polysilicon for emitters results in the highest performance silicon bipolar transistors to date.

As linewidths shrink, the resistance of the contact between the polysilicon and the silicon substrate (or between polysilicon conductors) becomes more and more critical since less area is available for the contact. Similarly, to further improve the performance of bipolar transistors, the size of the emitter is reduced. As is the case for MOS devices, the smaller the emitter, the more critical the resistance of the interface (contact) between the polysilicon and the silicon substrate becomes.

Most prior art integrated circuit fabrication processes deposit the polysilicon in one apparatus after cleaning the silicon wafers in another. A typical wafer clean removes most of the contaminants on the silicon by an operator dipping the wafers in a dilute solution of hydrogen fluoride and then rinsing them in deionized water. This clean is done at room temperature and at normal atmospheric pressure. However, the surface of the silicon may not be sufficiently clean for a low resistance polysilicon to silicon contact to be made. Native oxides will form on the exposed silicon surfaces almost immediately when exposed to air after the wafers are cleaned and before they are placed in the polysilicon deposition reactor. In addition, other contaminants may adhere to the exposed silicon, forming defects at the silicon-to-polysilicon interface.

When polysilicon is deposited on the imperfectly cleaned silicon (or polysilicon) surface and the area of the interface between the polysilicon and silicon is sufficiently small, the resulting contact may not have low enough resistance to allow the integrated circuit to be operational. Even if the contact resistance is low enough for the circuit to be operational, the reliability of the circuit will be degraded since the native oxide "defect" could change and increase the contact resistance. Similarly, the junction between the polysilicon emitter and silicon substrate in a bipolar transistor may have defects therein caused by the native oxides. These defect areas may form recombinant zones which increases the leakage and series resistance of the junction while decreasing the emitter efficiency, thereby degrading the overall performance of the transistor.

SUMMARY OF THE INVENTION

It is therefore one aspect of the invention to provide a method of cleaning a silicon (or polysilicon) surface and depositing polysilicon thereon, the interface between the silicon and polysilicon being substantially clear of native oxides and other impurities.

Another aspect of the invention is the improved integrated circuit resulting from using the process described herein.

This and other aspects of the invention are basically realized by selectively etching at least one silicon wafer with an anhydrous etchant and depositing polysilicon on the silicon wafer where etched. The etching and depositing steps occur in the same reactor chamber (in-situ). A portion of the end of the selective etching step overlaps with a portion of the beginning of the deposition step to achieve an interface between the underlying silicon and the deposited polysilicon that is substantially free of native oxides and other contaminants.

BRIEF DESCRIPTION OF THE DRAWING

The foregoing aspects of the invention, as well as the invention itself, may be more fully understood from the following detailed description of the drawings, in which.

DETAILED DESCRIPTION

Figure 1:
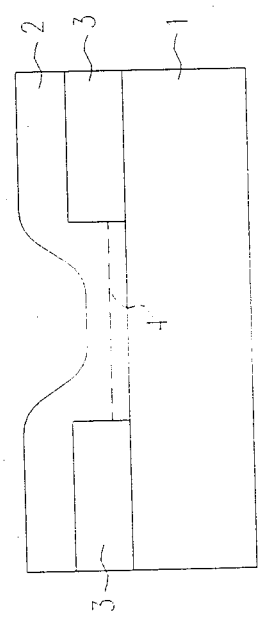
FIG. 1 is a cross-sectional view (not to scale) of a silicon substrate having thereon an opening in a masking layer into which a layer of polysilicon is deposited after an in-situ cleaning.

By etching away any native oxides or other contaminants on the surface of an exposed area of silicon (or polysilicon) onto which polysilicon is to be deposited, the resulting polysilicon-to-silicon interface will have few defects therein, resulting in a lower resistance contact. Doing the etching in-situ with the polysilicon deposition and overlapping the etching and deposition steps, the resulting interface is substantially free of defects. This is illustrated in FIG. 1 (not to scale) in which a silicon wafer 1 has deposited thereon a polysilicon layer 2. The polysilicon layer 2 contacts the underlying silicon where an opening in a masking layer 3 (typically silicon dioxide) exposes the underlying silicon. Conventional processing techniques open the masking layer 3 in an etching machine and the wafer 1 is then cleaned in an apparatus which removes any residual damage from the surface of the silicon wafer 1 resulting from the masking layer 3 etch. The wafer 1 is then placed into a machine in which the polysilicon is deposited. However, the exposure of the exposed silicon to oxygen causes a native oxide to form on the wafer almost instantly, represented by the layer 4 in FIG. 1. In addition, other contaminants, such as pump oil, may deposit on the exposed silicon surface. The native oxide and other contaminant layer 4 must be removed prior to polysilicon deposition for the polysilicon to make good contact. It has been discovered that by doing an in-situ etch of the exposed silicon 1 with an anhydrous etchant prior to and overlapping the polysilicon deposition step, the removal of layer 4 is substantially complete. It is noted that this discovery is applicable to growing polysilicon on polysilicon as well as polysilicon on silicon.

EXEMPLARY EMBODIMENT

Figure 2:
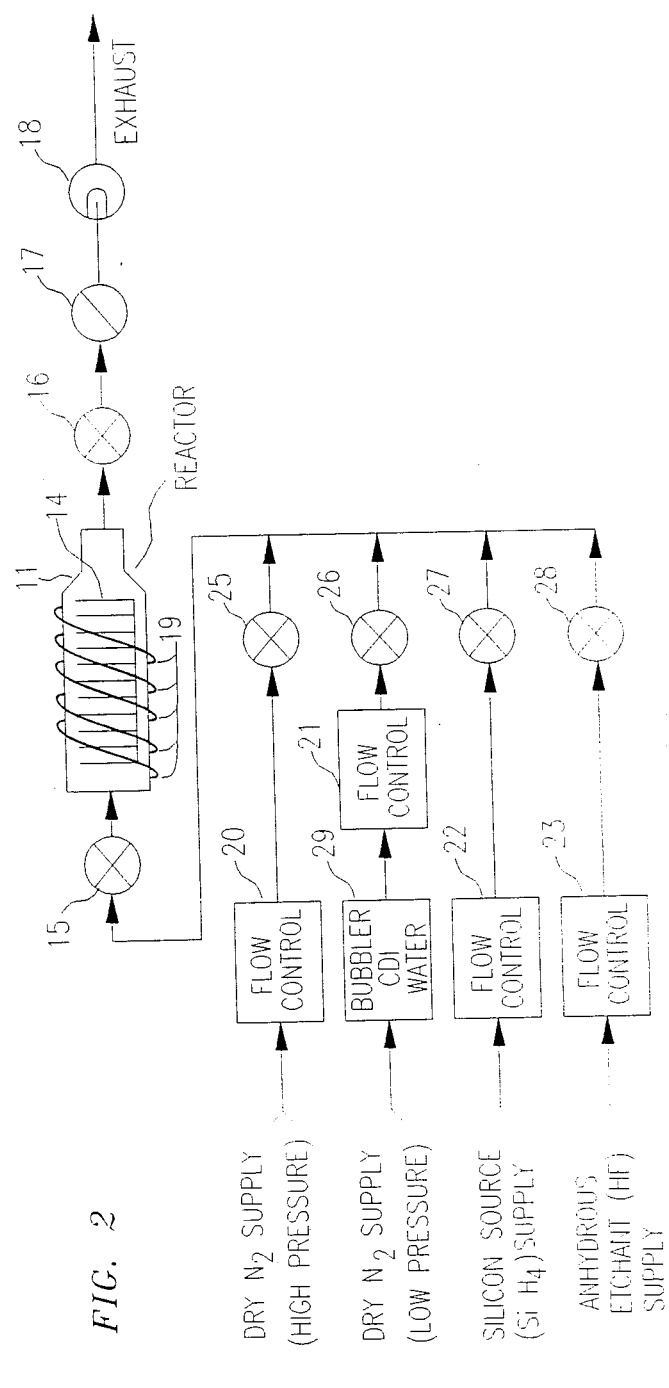
FIG. 2 is a simplified block diagram of an exemplary polysilicon deposition reactor modified to perform the in-situ clean; and, FIG. 3 is an exemplarily program for the in-situ cleaning step and polysilicon deposition step using the reactor of FIG. 2.

In FIG. 2, an exemplary embodiment of an in-situ etching and polysilicon deposition machine 10 is shown in simplified schematic form. The machine 10 is typically a modified low-pressure chemical vapor deposition (LPCVD) machine, such as a Bruce LPCVD system, made by BTU Engineering Corporation, Bruce Systems Division, of North Billerica, Mass. Four gas sources, saturated (wet) and dry nitrogen ($N_2$), silane ($SiH_4$), and anhydrous hydrogen fluoride acid (HF) are introduced into a reactor 11 in which silicon wafers 14 are placed. All the source gasses are passed through valve 15 and enter the reactor 11. The outlet of the reactor 11 is coupled to a gate valve 16 and, in turn, to a throttle valve 17. Throttle valve 17 is coupled to vacuum pump 18, the throttle valve 17 controlling the vacuum pressure in the reactor 11. Heating elements 19, typically coils carrying RF energy, control the temperature of the wafers 14 and the gasses within the reactor 11.

The mixture of the $N_2$, $SiH_4$, and HF in the reactor 11 is controlled by the corresponding flow control units 20, 21, 22, and 23 and valves 25, 26, 27, and 28. The flow control units 20, 21, 22, and 23 are typically under the control of a process control computer (not shown). The dry high pressure $N_2$, through flow control 20 and valve 25 is used as a purge gas for the reactor 11.

As will be discussed in more detail below, the etching process using an anhydrous etchant may require the presence of water vapor to promote etching, as is the case with anhydrous HF. To introduce the desired amount of water vapor into the reactor 11, a controlled amount of dry low pressure $N_2$ is passed through a bubbler 29, which saturates the $N_2$ with water vapor, then through flow control 21 and valves 26, 15 into the reactor 11. The bubbler typically has therein deionized water (DI) as the source of the water vapor.

Figure 3:
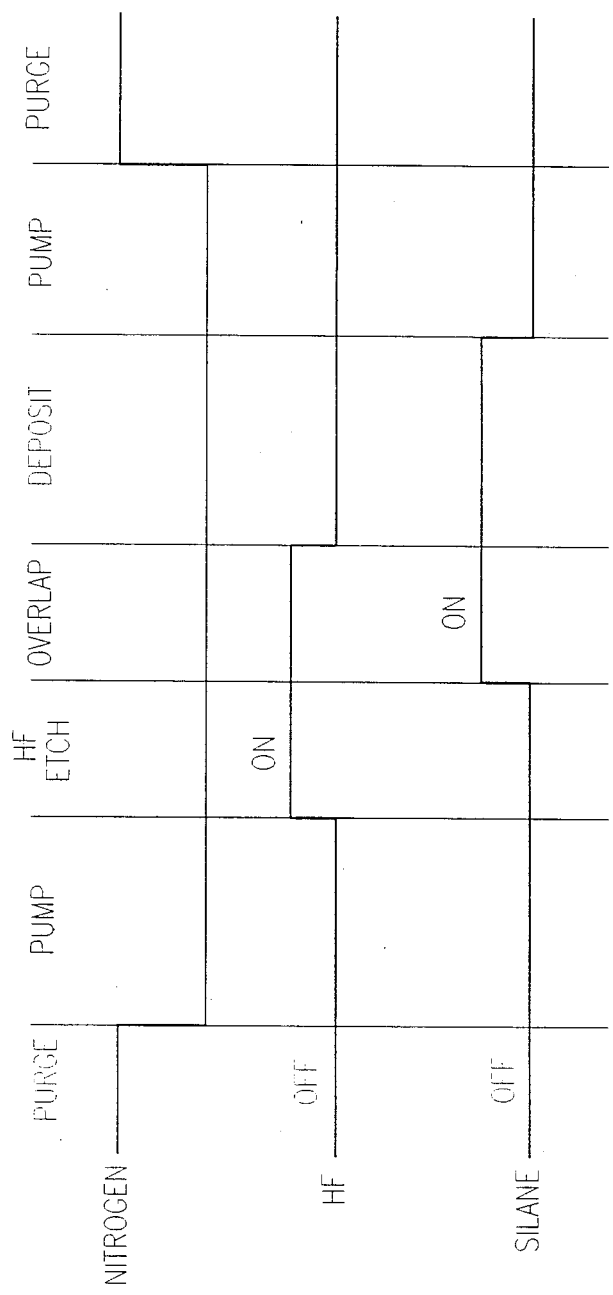

The operation of the exemplary machine 10 of FIG. 2 is shown in FIG. 3 as a "program" detailing the sequence of gasses introduced into, and the temperature of, the reactor 11 to achieve the removal of the native oxide layers and the subsequent polysilicon deposition. An exemplary sequence of steps are given herein which substantially removes native oxides and other contaminants from the exposed areas on a silicon wafer and deposits polysilicon thereon.

Once the wafers 14 (FIG. 2) are placed in the reactor 11, the reactor 11 is purged with nitrogen. Then the vacuum pump 18 is turned on and the pressure within the reactor 11 is reduced (pumped down) to a first desired pressure and checked for leakage. It is noted that, for this embodiment, the heating elements 19 are always on. Once the first desired pressure has been reached, the anhydrous HF is introduced and, if needed, the water saturated $N_2$ is added. Since the introduction of the gasses into the reactor 11 will raise the pressure therein, the throttle valve 17 is adjusted to maintain the pressure to a second desired pressure. After a predetermined amount of time, the $SiH_4$ gas is introduced during which time the HF gas remains on. This overlap period assures the cleanliness of the exposed regions on the wafers 14 when the polysilicon growth starts. At the end of the overlap period, the HF gas is turned off, the throttle valve 17 is adjusted to maintain a third desired pressure in the reactor 11, and the polysilicon growth continues until the desired thickness thereof is reached. Then the $SiH_4$ is turned off, the pressure in the reactor 11 is again reduced (pumped down), and then the reactor is purged again with dry $N_2$, completing the polysilicon growth process step.

As stated above, in this embodiment, the heating elements 19 remain on at all times. However, the temperature of the wafers 14 and the gasses in the reactor 11 may not be at the desired temperature at all times, such as when the wafers 14 are first placed in the reactor 11. It is understood, however, that the desired temperature should be reached before the introduction of $SiH_4$ into the reactor 11.

Once the polysilicon is deposited, the wafers 14 are removed from the reactor 11 and subject to an implant to introduce dopant into the polysilicon. The wafers 14 are then annealed in an rapid thermal annealer (not shown) to activate the dopant and relieve stress in the wafer due to the polysilicon deposition and implant. Typically, the rapid thermal anneal is done in a dry nitrogen atmosphere at temperatures over 1000° C.

The following table indicates the allowable and the desired ranges for the temperature, pressure, and flow rates for the various gasses in the reactor 11.

|  | RANGE | PREFERRED VALUES |
|---|---|---|
| Temperature | 600°–675° C. | 625° C. |
| Pressure |  |  |
| First | <100 milliTorr | 50 milliTorr |
| Second | 0.1–1 Torr | 200 milliTorr |
| Third | 0.1–1 Torr | 300 milliTorr |
| Flow Rates for: |  |  |
| HF | 50–150 cc/minute | 100 cc/minute |
| $SiH_4$ | 100–175 cc/minute | 120 cc/minute |
| HF Etch Time (No $SiH_4$) | 5–20 minutes | 10 minutes |
| Overlap Time | 0.5–2 minutes | 1 minute |
| Polysilicon Deposit Time (No HF) | 3 minutes–1 hour | 4 minutes (for 20 nanometers) |

Polysilicon deposited on wafers using the preferred values given above has resulted in 20 nanometers thick polysilicon with the interface of the polysilicon and silicon wafer being substantially oxide free and at least 80% of the polysilicon has its atomic structure epitaxially aligned with the silicon substrate atomic structure after a rapid thermal annealing.

Although the gas used for the etching step in this example is anhydrous HF, other anhydrous etchants may be used, such as dry hydrogen at a higher reactor temperature. The addition of the saturated $N_2$ may not be necessary if sufficient water vapor is present in the reactor after the pump-down thereof.

Similarly, the silicon source gas for growing the polysilicon in this example is silane ($SiH_4$). Other silicon source gasses may be used, such as dichlorosilane.

Having described the preferred embodiment of the invention, it will now be apparent to one of skill in the art that other embodiments incorporating its concept may be used. It is felt, therefore, that this invention should not be limited to the disclosed embodiment, but rather should be limited only by the spirit and scope of the appended claims.

We claim:

1. A method of fabricating an integrated circuit, characterized by the steps of:
    selectively etching at least one silicon wafer with an anhydrous etchant; and,
    depositing polysilicon on the silicon wafer where etched;
    wherein a portion of the end of the selective etching step overlaps with a portion of the beginning of the deposition step.

2. The method of fabricating an integrated circuit as recited in claim 1, further characterized by the steps of:
    placing the silicon wafer in a reactor vessel;
    forming a vacuum in the vessel; and,
    increasing the temperature of the wafer to a predetermined temperature;
    wherein the anhydrous etchant is introduced into the vessel before the vacuum formation step.

3. The method of fabricating an integrated circuit as recited in claim 2, wherein the anhydrous etchant is anhydrous fluoride.

4. The method of fabricating an integrated circuit as recited in claim 2, wherein the polysilicon is formed using silane as a source.

5. The method of fabricating an integrated circuit as recited in claim 4, wherein the predetermined temperature is greater than 400° C. and the pressure in the vessel is less than one torr.

6. A method of fabricating an integrated circuit, characterized by the steps of:
    placing a plurality of silicon wafers in a reactor vessel;
    introducing an anhydrous etchant into the reactor vessel;
    forming a partial vacuum in the reactor vessel;
    heating the wafers to a predetermined temperature;
    flowing the anhydrous etchant over the wafers;
    flowing a silicon source gas over the wafers to produce polysilicon;
    stopping the anhydrous etchant flow; and,
    stopping the silicon source gas flow;
    wherein the end of the flowing of the anhydrous etchant step and the beginning of the flowing of the silicon source gas step overlap.

7. The method of fabricating an integrated circuit as recited in claim 6, further characterized by the steps of:
    implanting a dopant into the thus formed polysilicon; and,
    annealing the wafers.

8. The method of fabricating an integrated circuit as recited in claim 7, wherein the anhydrous etchant is an anhydrous hydrogen fluoride and the silicon source gas is silane.

9. The method of fabricating an integrated circuit as recited in claim 8, wherein the partial vacuum is less than one torr, and the predetermined temperature is greater than 600° C.

10. The method of fabricating an integrated circuit as recited in claim 9, wherein the annealing step is rapid thermal anneal in an atmosphere of nitrogen at a temperature greater than 1000° C.

* * * * *